(12) United States Patent
Moltchanov et al.

(10) Patent No.: US 8,201,070 B2
(45) Date of Patent: Jun. 12, 2012

(54) SYSTEM AND METHOD FOR PRE-CALCULATING CHECKSUMS

(75) Inventors: Vladmir Moltchanov, Masala (FI); Sergey Balandin, Helsinki (FI)

(73) Assignee: Nokia Corporation, Espoo (FI)

( * ) Notice: Subject to any disclaimer, the term of this patent is extended or adjusted under 35 U.S.C. 154(b) by 910 days.

(21) Appl. No.: 12/252,061

(22) Filed: Oct. 15, 2008

(65) Prior Publication Data

US 2010/0095193 A1  Apr. 15, 2010

(51) Int. Cl.
*G06F 11/00* (2006.01)
(52) U.S. Cl. ........................................ 714/807
(58) Field of Classification Search .................. None
See application file for complete search history.

(56) References Cited

U.S. PATENT DOCUMENTS

| | | | | |
|---|---|---|---|---|
| 6,788,692 B1 * | 9/2004 | Borden et al. | ............. | 370/400 |
| 2002/0133783 A1 * | 9/2002 | Oldfield et al. | ............. | 714/800 |
| 2004/0059967 A1 * | 3/2004 | Kleppel et al. | ............. | 714/52 |
| 2004/0235523 A1 * | 11/2004 | Schrire et al. | ............. | 455/558 |
| 2005/0279837 A1 * | 12/2005 | Hajji | ............. | 235/492 |
| 2010/0023847 A1 * | 1/2010 | Morita et al. | ............. | 714/801 |

OTHER PUBLICATIONS http://www.ecsl.cs.sunysb.edu/nccache/, printed Nov. 6, 2008.

* cited by examiner

*Primary Examiner* — Gabriel Chu
(74) *Attorney, Agent, or Firm* — Banner & Witcoff, Ltd

(57) ABSTRACT

In a packet transmission system that uses checksums, partial checksum calculations may be performed during periods of processor underutilization while the data is awaiting final output processing for transport. A system wide checksum service process may coordinate checksum calculations across multiple network protocol layers. The checksum calculations for the buffered data may be performed according to a priority assigned to the buffered data. For example, buffered data whose transmission is imminent may have a higher priority than buffered data that will be transmitted at a later time. Applications that generate data for transmission may register those portions with the service for checksum calculation. To simplify the process, a metadata structure may be created for the data portion, and used to manage the checksum calculations.

21 Claims, 7 Drawing Sheets

Protocol Stack Model

SYSTEM AND METHOD FOR PRE-CALCULATING CHECKSUMS

FIELD OF ART

The features described herein generally to techniques for optimizing the calculation of checksums, such as those used in networking protocols to validate the correctness of data after transmission.

BACKGROUND

The checksum is a standard approach to validate the correctness of data in a storage device or over a communication channel. Checksums are used in many networking protocols to ensure that data is not corrupted during transmission over a network. For example, transport protocols such as User Datagram Protocol (UDP), Transmission Control Protocol (TCP), Datagram Congestion Control Protocol (DCCP), and Stream Control Transmission Protocol (SCTP), which send data in packets, utilize a checksum calculation as an integral part of the protocol operation. Such protocols typically provide for a checksum in each packet with the checksum being calculated by summing the entire packet data by bytes or words.

The typical way of calculating checksums for the packets is to sum in a certain way bytes of the outgoing packet or its portion in the transport protocol layer just before transmission of the packet. These checksum calculations are processor-intensive, and must also be run concurrently with other active tasks that time-share the CPU.

The high checksum processing requirements and concurrent execution increases the peak computation rate requirement of the system executing the networking stack, which in turn, increases the system's power consumption and heat dissipation requirements. Power and heat are concerns for all electronic devices and are of particular concern in battery-powered mobile devices.

Further, when the processor cannot keep up with the processing, output processing of the packets and other concurrent processes are slowed, which in turn may negatively impact important characteristics of the communication path such as round-trip-time. There is always a need for improved processing performance.

SUMMARY

This summary is not intended to identify critical or essential features of the inventions claimed herein, but instead merely summarizes certain features and variations thereof.

Certain embodiments include devices and methods for distributing checksum calculations over time as to reduce overall output processing time of packets.

Features described herein include an apparatus, such as a computer or cell phone, configured to buffer data to await output processing for packet transmission. While waiting, if system resource utilization falls below predetermined threshold, the apparatus may initiate the checksum generation process, and generate an initial checksum calculation using the buffered data. During this process, the various pieces of buffered data may be assigned a priority based, for example, on the data type and/or the time remaining before the data is to be transmitted, and that priority may be used to determine which portions are processed, and when. For example, checksum calculations for buffered data may be performed at a lower priority than checksum calculations for data that is currently being processed for output. The priority may be implemented using a series of prioritized queues of pointers to data portions (or the data's metadata).

When the time arrives for the buffered data to be processed for output, the output processing may retrieve the previously-calculated checksum data, and may use it with further calculations to complete the checksum process for the data to be sent in an upcoming packet transmission. Completing the checksum calculation may also involve retrieving checksum data that was used in a prior packet (e.g., if a subsequent packet includes data in common with a prior packet). The completed packet may be generated according to a transport level protocol, and the completed checksum for the packet may be placed within the packet for transmission.

Other details and features will also be described in the sections that follow.

BRIEF DESCRIPTION OF THE DRAWINGS

Some features herein are illustrated by way of example, and not by way of limitation, in the figures of the accompanying drawings and in which like reference numerals refer to similar elements.

DETAILED DESCRIPTION

Networking protocols are typically described in terms of a networking stack composed of protocol layers logically stacked upon each other. Networking protocols work by each layer receiving data from the layer above it, processing the data, and then passing the processed data to the layer below it for further processing. At the top of the stack is typically the application layer, which generates the data to be transmitted over the network. At the bottom of the stack are typically network, data link, and physical layers which are responsible for addressing, routing, error correction and physical transmission over the network of data frames which typically consist of several packets. Below the application and other higher level layers and above the network layer is typically a transport protocol layer as described above. The processing performed by the transport layer is to divide the application data into packets at the transmitter networking stack, and to reassemble the application data in the correct order from the packets at the receiver networking stack.

Figure 1:
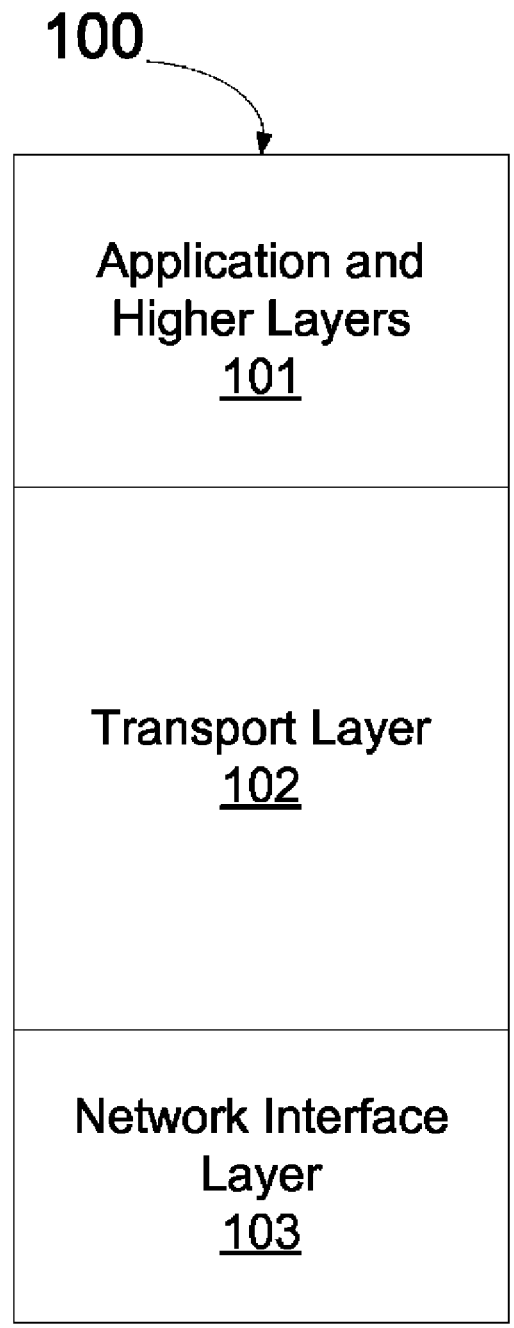
FIG. 1 is a block diagram of a typical stack architecture found in the prior art for implementing networking protocols.

One example networking protocol is the Open System Interconnection Model, which consists of the seven layers illustrated in FIG. 1. At the top of the stack is the application layer 101, which generates the data to be transmitted over the network. Under the application layer are the presentation and session layers (not illustrated) which generally manage communication and file compatibility between the application layer 101 and lower layers. At the bottom of the stack are typically network, data link, and physical layers, collectively referred to as the network interface layers 103, which are responsible for addressing, routing, error correction and physical transmission over the network of data frames which typically consist of several packets. Below the application 101 and the other higher level layers and above the network interface layers 103 is typically a transport protocol layer 102. In the OSI model, the transport protocol layer is responsible for flow control and ensuring data is completely transmitted to a receiving stack. Examples of various transport protocol layers include Transmission Control Protocol (TCP), User Datagram Protocol (UDP), Datagram Congestion Control Protocol (DCCP), and Stream Control Transmission Protocol (SCTP).

Figure 2:
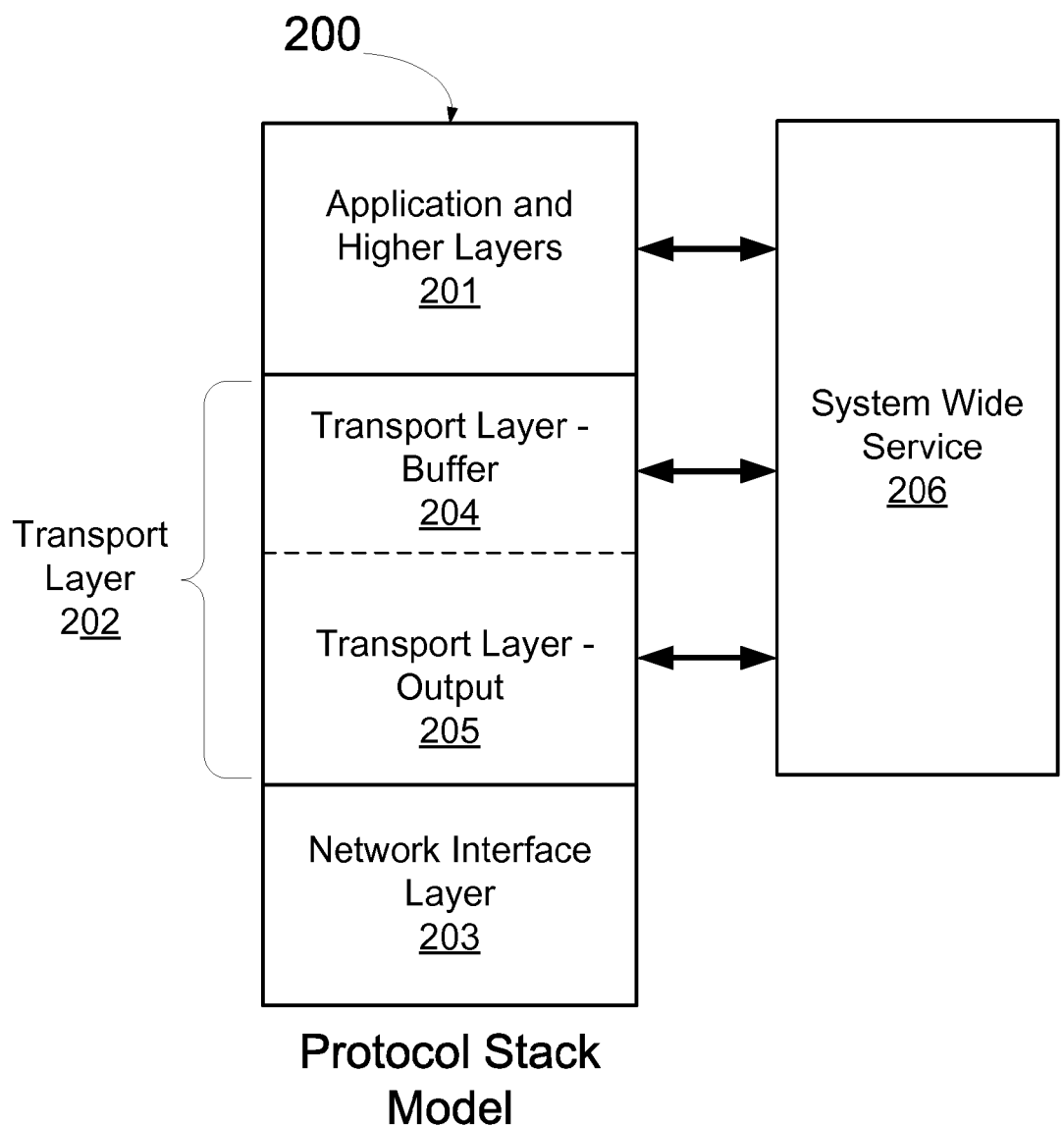
FIG. 2 is a block diagram of an exemplary embodiment of a stack architecture for implementing networking protocols as described herein.

FIG. 2 is a block diagram of an exemplary embodiment of a modified networking stack architecture. Application layer 201, transport layer 202 and network interface layer 203 also appear in this stack, similar to the model shown in FIG. 1. However, the protocol layer 202 may further be logically divided into a transport buffer stage 204 and a transport output stage 205. The transport buffer stage 204 serves to store data generated by the application and other higher layers until the transport output layer is ready to generate the packets for sending the data through the network. For example, data that is generated by an application and ready for transmission may wait in the buffer stage 204 until the physical transmission resources needed are available, or until the output processing for the transmission of that data is permitted to occur.

The transport layer output stage 205 may formulate packets that can include header data, payload data, and a checksum. The header data and payload data may generally be received from the transport layer buffer stage 204 (although some of this data may also be generated in the output stage 205), or may alternately be retrieved from a data cache (not shown). In an example embodiment, the cached data may be data that is saved from previously processed packets, or saved as static data to be utilized for a number of different packets over time. An example of cached data might be the destination or source address for a particular network connection that does not change for several packets. Depending on implementation, the packets formed in the output stage 205 may be formed at the network interface layer 203 as well.

For pieces/chunks of cached data that may be awaiting packet processing in the buffer stage 204, or for pieces of data that may have been created at the application or higher layers, but that have not yet been sent to the buffer stage 204, a portion of the checksum calculation may be completed for the packet that will eventually be formulated to carry the data. The result of the portion of the checksum calculation may then be stored as partial checksum data for later use by the transport layer output stage 205 for final calculation of the checksum. The system wide checksum service 206 may coordinate these checksum partial calculations among different applications and data buffers, and among different protocols and protocol layers, so that at least a portion of the checksum calculation can be performed while the data is awaiting output processing.

The system wide service 206 may calculate partial checksums for data that is not yet in a transport protocol buffer for output processing. Applications that generate these portions of data may first register them with the service (discussed further below), and the service may operate on the registered data portions to generate some or all of the checksum data during low-usage periods (e.g., idle or underutilized periods) of the system processor. When the data portions are actually ready for output processing, the service 206 may continue to manage the generation of the final checksum calculation—it may simply do so at a higher level of priority than before.

Figure 3:
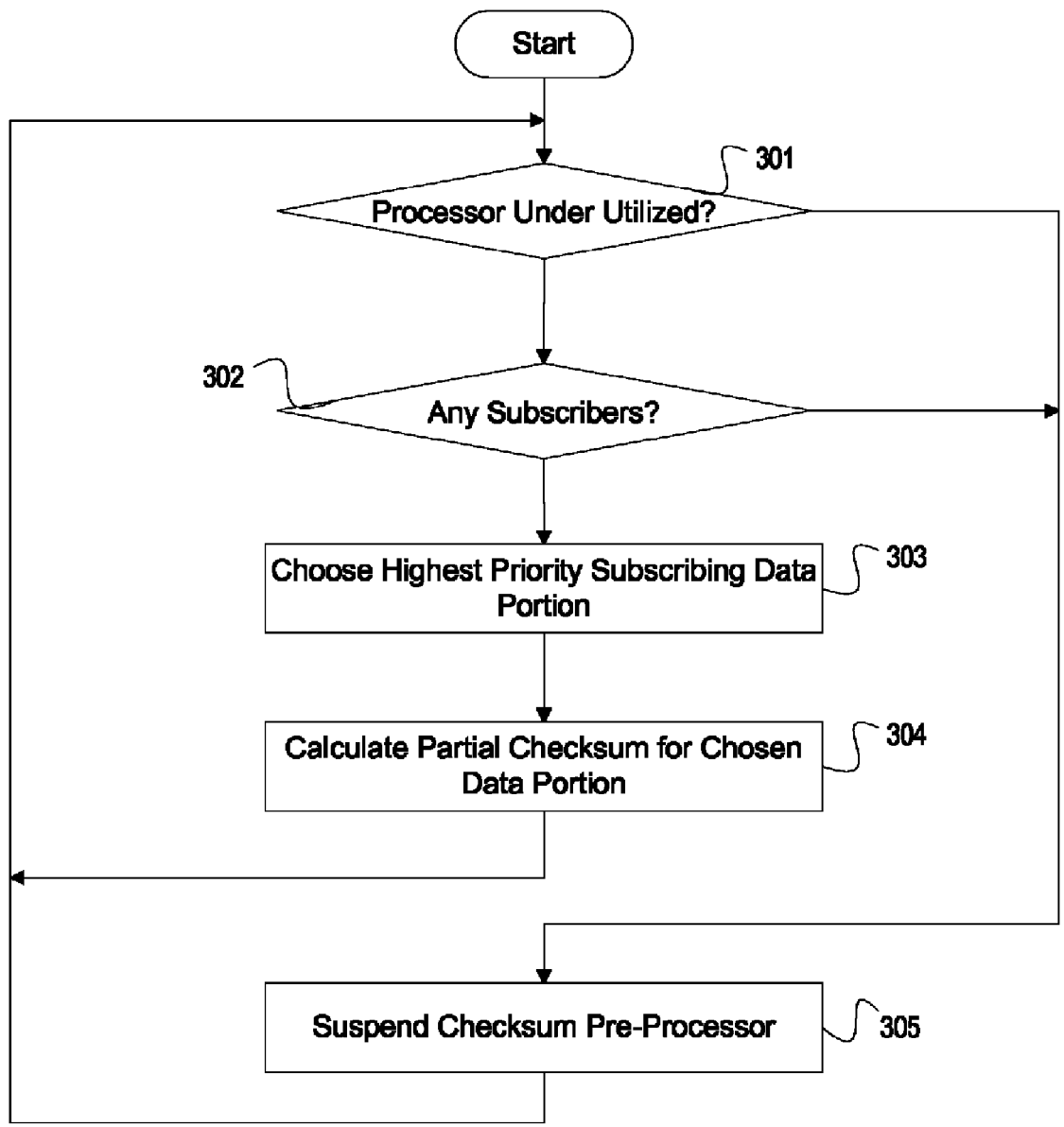
FIG. 3 is a flow diagram illustrating a system-wide checksum service's calculations of partial checksums.

Turning to the FIG. 3 example, the service 206 may be triggered in step 301 when the overall computing resources (e.g., the processor of the cell phone, computer, etc.) are determined to be under utilized. A resource, such as a computing device's processor, may be considered under utilized if it has capacity to perform checksum calculations for at least a portion of data without interfering with other running processes. Any type of processor and thread priority management may be used for this purpose and the particular level of utilization that is considered "under" utilized may vary as desired by device and/or implementation. For example, the system may determine whether a given percentage of the processor's capability has been used (e.g., 50%, 20%, 10%, etc.), or if enough time (e.g., 10 ms, 20 ms, etc.) has passed since the processor has been called to take on another process.

If the resources are not underutilized, the process may remain at step 301 to await a time when the resources are underutilized. If the resources are underutilized, the process may proceed to step 302, in which the system-wide service 206 checks to determine whether any portions of data have been subscribed to the service for checksum pre-calculation.

If there are subscribing data portions, then the process may proceed to step 303, in which the system-wide service 206 may select the data portion having the highest priority. There may be many bases for this priority determination. For example, each data portion may have a time-to-output associated with it, indicating how much time remains before the data portion needs to be sent out. Portions having a shorter time-to-output may have a higher priority than other portions. As another basis for priority, the application generating the data portion may ask that the portion be handled with an identified priority level. For example, an application may indicate that a first data portion should be sent with "high" priority, and that a second, less urgent portion, should be sent with a "low" priority. As yet another basis for priority, different applications may have different priority levels associated with them. For example, a first application might be deemed to be more urgent or important than a second application, and data portions from the first application may be given a higher priority than the second application.

When the highest priority portion is chosen, the process in step 304 computes the partial checksum computation on the chosen data portion. The actual calculation depends on the particular type of checksum and checksum algorithm that will be needed for transport. When the partial checksum is calculated, it may be stored in memory (e.g., it may be written to metadata associated with the data portion, discussed below), and the process may then return to step 301 to determine if the system resources are still under utilized, in which case another data portion may have its checksum partially calculated.

If, in step 302, it was determined that no subscribing portions are awaiting the partial checksum calculation, the process may proceed to step 305, in which the checksum preprocessor may be suspended until the next time the system resources are determined to be underutilized.

Figure 4:
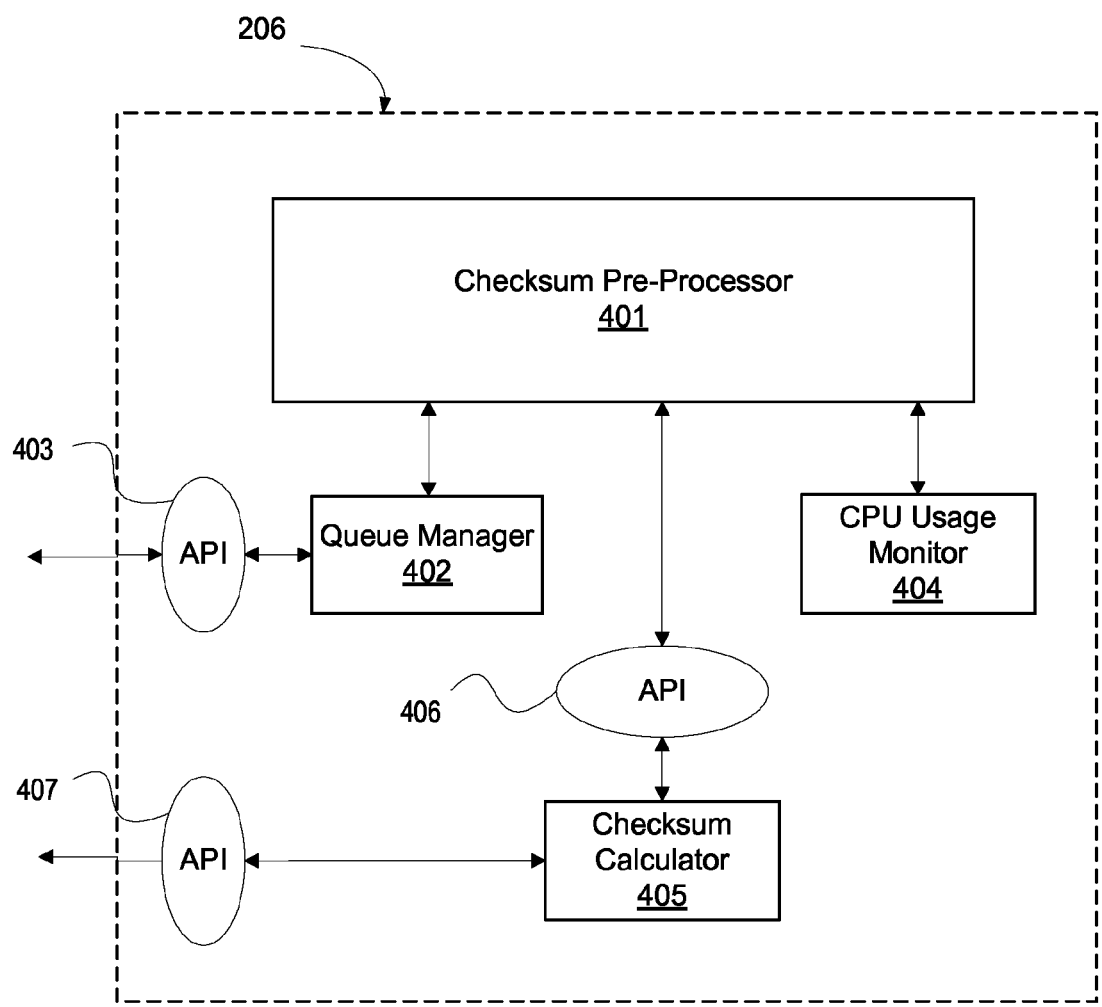
FIG. 4 is a logical component diagram for an example of the system-wide service described herein.

FIG. 4 illustrates basic logical components of the system-wide service 206, which may be implemented as software, hardware, or a combination of software and hardware. The first component is the checksum pre-processor 401, which may manage the overall operation of the partial checksum calculations described herein. The management may include determining the priority order for the various data portions subscribed to the service, selecting a data portion for checksum processing when the system resources are underutilized, determining the type of checksum calculation that will be needed (e.g., depending on the transport protocol in use) and storing the resulting partial checksum results.

The queue manager 402 may handle the details of subscriptions to the system-wide service 206. For example, when an application has a data portion that is ready for checksum pre-calculation, the application may make a call to the queue manager 402. That call may be made, at the application level or kernel level, using an application program interface (API) 403 to the queue manager 402. The specific parameters used for API 403 may vary upon implementation. One example parameter may be a pointer data element, pointing to the data portion's location in memory. The pointer element may alternatively point to a metadata structure associated with the data portion. The metadata structure may serve as a wrapper for the data portion, and may include the data portion itself, but it may also include other associated information, such as the size of the portion, timing information (identifying when, or how soon, this particular portion needs to be transmitted), connection monitor data (identifying status and/or protocol settings used to calculate the checksum), data portion checksum object (the calculated checksum for the portion), checksum object observer (for checksum algorithms that have multiple stages of calculations, the checksum object observer value may indicate the stage of completion, which may be useful if the checksum calculation is interrupted), and/or data portion reliability information. Along with managing subscriptions to the service, the queue manager 402 may similarly manage the removal of subscriptions, such as when a data portion un-subscribes from the service because it is ready for immediate output processing.

The queue manager 402 may also maintain a registry of the various data portions that have subscribed to the system-wide service 206. The registry may be arranged in any desired manner in memory, such as one or more prioritized lists of subscribing data portions (or pointers). For example, the queue manager 402 may maintain a high priority queue, a medium priority queue, and a low priority queue, listing subscribed data portions according to their priorities (as discussed above). Data portions within a queue, such as the portions in the medium priority queue, may also be ordered according to their relative priorities. The queue manager 402 may include user/kernel level interfaces for subscribing and unsubscribing from the service, and for otherwise controlling the priority queues. It may also synchronize data between the subscribing data portions (e.g., their metadata structures) and the checksum pre-processor, in case there are concurrency issues. For example, if the partial checksum calculation for a particular data portion is interrupted (e.g., if the data portion is needed for immediate output processing and transport), the queue manager 402 may provide a signal to the pre-processor 401 indicating the progress that was made in the checksum partial calculation. This progress information can be passed in the metadata structure's checksum observer value, discussed above.

The system-wide service 206 may also include a central processing unit (CPU) usage monitor 404, which may be responsible for monitoring the level of CPU usage, and for identifying when the usage falls below the threshold for being "under" utilized. Although illustrated as a CPU usage monitor, the monitor 404 may monitor any type of system resource (e.g., available memory, existing traffic, etc.) being used, and those resources may be taken into consideration when reporting on whether resources are under utilized. When resources are underutilized (e.g., if usage falls below a predetermined threshold, noted above), the CPU monitor 404 may send a signal to the pre-processor 401, triggering step 301 discussed above. In operation, the pre-processor 401 may query the usage monitor 404 after the checksum calculation for each data portion, as described above in the transition between steps 304 and 301.

The system-wide service 206 may also include a checksum calculator 405, which may be a process (e.g., a software library or module) responsible for actually carrying out the checksum calculation. Any desired checksum algorithm may be used, so the system-wide service 206 may have many different checksum calculators 405, and a single calculator 405 may support calculating different types of checksum values. The checksum calculator 405 may include an interface 406 to the pre-processor within the service 206 as well as an interface 407 to the user/kernel outside the service 206, to unify the process of checksum calculation. For example, checksum parameters and results may be passed between the calculator 405 and the pre-processor 401, and/or the user or application outside of the service 206. The use of these interfaces, and the various components, is illustrated in the FIG. 5 process, described below.

Figure 5:
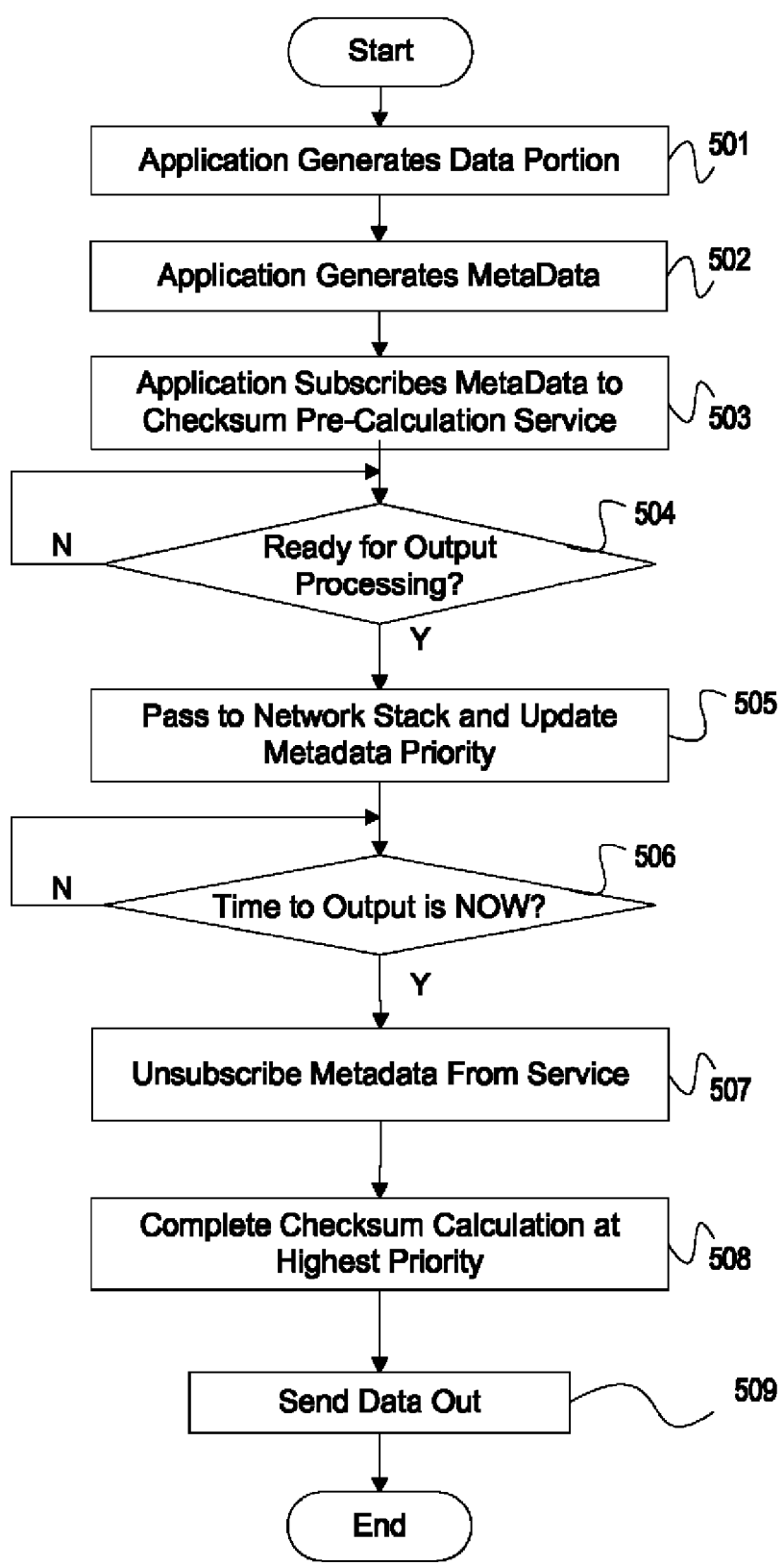
FIG. 5 is a flow diagram indicating an example of an application's use of the system-wide service described herein.

FIG. 5 illustrates a checksum process from the point of view of the application whose data is to be transported. The FIG. 5 process may occur concurrently with the FIG. 3 process. First, in step 501, the application generates the data portion. The size of the data portion may be subject to implementation. For example, the application may determine the data payload size for the packets used for transmission (e.g., through an API call, as discussed below), and/or the amount of available space in an upcoming packet, and it may size the data portion to fit within the available space. In some embodiments, the application may ensure that data portions are all at least small enough "chunks" to fit within a single packet's payload.

After the data portion is generated by the application, the application may generate, in step 502, a metadata structure associated with the portion, as discussed above. Then, in step 503, the application may subscribe the data portion (by its metadata wrapper) to the system-wide checksum service 206 by making an application call through API 403. As noted above, that call may pass simply a pointer to the metadata for the data portion. After step 503, the application can proceed to step 504, and determine whether the data portion needs to begin its output processing (e.g., sent to the network layer stack for transmission). If it is not ready for the network layer output processing, the process may remain at step 504. During this time, the service 206 may undergo the FIG. 3 process to calculate partial checksums during periods of CPU underutilization.

When the data portion is ready for output processing, the process may advance to step 505, in which the application may pass the metadata on for output processing (e.g., to the transport layer output stage 205, or to the network interface layer 203's stack for output processing). This may be handled via another call through API 403. When this metadata is passed, the hardware/software managing the output processing (e.g., according to a network protocol) may increase the priority of the metadata to reflect the fact that this data portion is closer to being transmitted, for example, by comparing a time-to-output value of the metadata with a threshold value for the higher priority level. Again, this may be handled via a call through API 403.

Then, in step 506, the hardware/software handling the output processing may check to determine whether the time-to-output for the data portion is "now" (e.g., the shortest threshold time value in the priority order, indicating the data is needed for immediate output), and if it is, then the data portion needs to begin final output processing. The data portion is unsubscribed from the service at step 507, the checksum calculation for the portion may be completed by calculator 405 at the highest level of priority, and the results may be output via API 407 for use in ultimately sending the data out in step 509.

The discussion above provides example processes, but modifications may be made depending on device and implementation. For example, various steps may be combined, omitted, delayed, and/or rearranged as desired. Other modifications may be made as well. One possible modification involves the generation of checksum data even before subscribing to the system-wide service 206. In such an example, an application may perform some of the checksum calculation at the application layer. Indeed, in the final packet, different portions of the transmitted data may have had their checksums performed at different layers, depending on design preference and system resource usage. Throughout the partial checksum calculations, intermediate results may be written to the metadata structure for the data portion.

As another modification, some of the calculated checksum data may be reused. For example, if certain data portions are known to be recurring, the metadata for those portions (or at least the checksum data) may be retained even after the initial packet is transmitted. In such cases, when the system selects a data portion in step 303, it skips portions whose checksums have already been calculated. Alternatively, such recurring portions need not even be registered with the service 206 for checksum calculations.

As another modification, the various applications (and users) may be provided with the option of deactivating the checksum precalculation described herein. For example, certain network traffic types (e.g., networks that do not use checksums, or which might not use checksums at transmission time) might not benefit from the precalculation.

As noted above, the application may size the data portions according to the available payload size in the packets that will be used for transport. Along the lines of the payload size, the application may also determine an anticipated range of payload space that will be available in the next outgoing packet. For example, the application may learn through an API call to the system-wide service 206 that the next packet is going to have 10 to 20 words of available space. Knowing this, the application may make the data portion small enough to fit.

To support the priority checking in step 303, the service 206 may buffer multiple queues of pointers to metadata for various data portions. For example, the manager 206 may maintain different queues for different priority levels, so that data portions identified in a higher-priority queue are processed before data portions identified in a lower priority queue. The pointers in the queues may be rearranged and moved to different queues as the priority changes for their corresponding data portions. For example, a pointer to a data portion may be moved to a higher priority queue when the time-to-transmit value for that data portion falls below a threshold, or becomes immediate. The various priorities may be based on any desired criteria, such as thread priority or time-to-output.

The system wide service 206 as shown if FIG. 2 may be a single process, or divided into multiple processes. In alternate embodiments, the flow may be integrated into the processes for implementing the protocol layers above the transport output stage. In yet further embodiments, the flow may be integrated into a different arrangement of networking layers and may be applied to data structures other than packets. The system wide service 206 may be a software application that manages generation of partial checksums for data prior to transport layer output processing according to priority (discussed below), and generation of final checksums during the transport layer output processing, where the generation of the final checksums may include retrieving previously-stored partial checksum data. The system wide service 206 may coordinate checksum pre-calculations among different applications and data buffers, and among different protocols and protocol layers.

Storage of the partial checksums or other related metadata may take on various forms as well. For example metadata associated with pieces of data in the buffer of the transport layer buffer stage 204 may be stored in the buffer as well. Alternatively, as another illustrative example, the system wide service 206 may store the metadata in a separate memory buffer to be retrieved by the transport layer output stage 205 at the time it is needed for assembling the packet. In another embodiment, partial checksums and other related metadata for cached data may be cached as well for use in a number of packets. In some embodiments, the service 206 simply passes metadata pointers at the various interfaces, so that the only additional buffering needed at the service 206 is for the priority queues.

Although an illustrative embodiment has been presented with respect to packets in a transport protocol layer 202 of a networking stack 200, other embodiments are possible for any networking protocol or protocol layer that utilizes checksums for detecting data corruption.

The various features described above may be supported by new application program interfaces (APIs). For example, one set of interfaces may be defined to allow communication between the system wide manager 206 and the various transport layer data buffers. These APIs may allows kernel-level subscription functionality between the transport layer buffer queue and the service. The API may include metadata exchange functionality between the service and the buffer. The APIs may also include user-level interfaces to subscribe to an application queue.

A third type of API may be provided, to allow the various applications to access the protocol/network/manager. The applications may use this to obtain information about the type of transport protocol being used, the type of checksum needed, supported checksum algorithms, etc. These interfaces can also be used to supply the system wide manager with information about the application, such as the data portions generated, checksums calculated at the application layer, etc.

Figure 6:
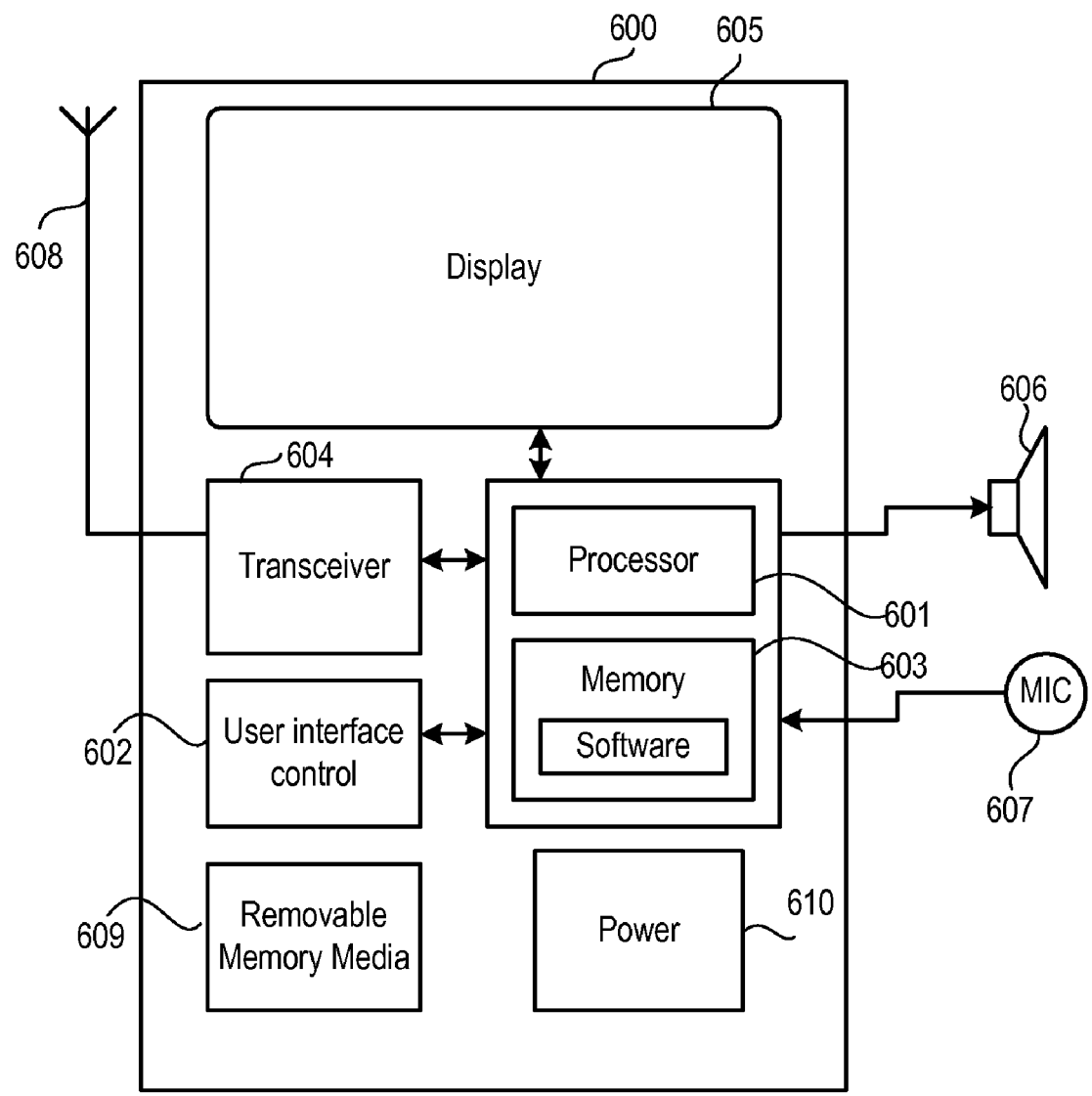
FIG. 6 is a block diagram of a wireless mobile terminal in which at least some embodiments may be implements.

FIG. 6 is a block diagram of an electronic wireless mobile terminal 600, an exemplary electronic device in which at least some features described herein may be implemented. Mobile terminal 600 may include one or more processors 601. Said processors may be communicatively connected to user interface control 602, memory 603 and/or other storage, a power interface 610, and one or more transceivers 604. Mobile terminal 600 may further include a display 605, speaker 606, microphone 607 and antenna 608. User interface control 602 may include controllers or adapters configured to receive input from or provide output to a keypad, touch screen, voice interface (microphone), function keys, joystick, mouse and the like. The power interface 610 may be of one or more various forms including an input adaptor for receiving external power, power converters, mechanical power generators, solar cells, and batteries.

Instructions readable and executable by processor 601 (e.g., computer-readable instructions) to perform all of the various steps and features recited above, as well as data and other elements, may be stored in a storage facility such as memory 603. Memory 603 may be implemented with any combination of read only memory (ROM) modules or random access memory (RAM) modules, optionally including both volatile and nonvolatile memory, and may store the various buffers described herein. Mobile terminal 600 may further include removable memory media 609, which may be implemented with any combination of CD, DVD, flash memory, tape, or other such erasable and non-erasable memory. Software may be stored within memory 603 or within removable memory media 609 to provide instructions to processor 601 such that when the instructions are executed, processor 601 and/or other elements of mobile terminal 600 are caused to perform various operations associated with mobile terminal 600, as described herein. Software may include applications, operating system software, and software for implementing a networking stack, and may include code segments, instructions, applets, pre-compiled code, compiled code, computer programs, program modules, engines and program logic.

Mobile terminal 600 may be configured to receive and/or transmit, decode and/or code and otherwise process various types of wireless communications and networking protocols according to at least some embodiments using various combinations of the components within the mobile terminal 600, including the one or more transceivers 604 to interface to a network. At least some embodiments may further include discrete analog circuit elements, a field programmable gate array, a microprocessor, and an integrated circuit.

Figure 7:
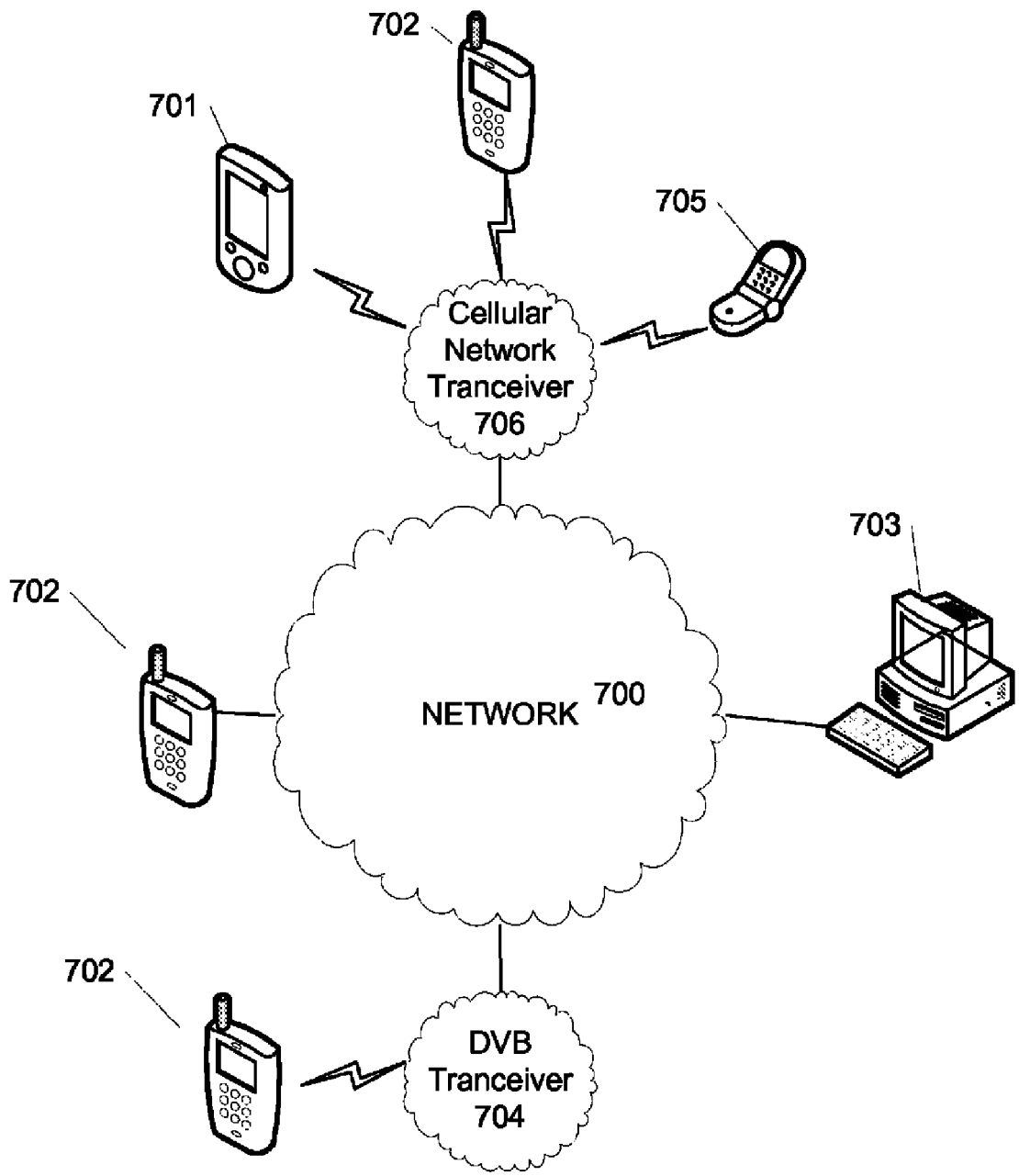
FIG. 7 is a block diagram of a representative network illustrating various electronic devices in which at least some embodiments may be implemented.

FIG. 7 is a block diagram of a representative network 700 illustrating various electronic devices in which at least some embodiments may be implemented. Although various embodiments have been described in the context of mobile terminal 700, other embodiments are implemented in a wide variety of network connected devices. By way of illustration, these include a Personal Digital Assistant (PDA) 701, various handheld multimedia devices 702, a personal computer 703, a Digital Video Broadcast transceiver 704, a cell phone 705, and a cellular network transceiver 706. Interconnection of the various devices and network are illustrated as an example only. Embodiments may interconnect in various other ways and may work with various other communication channels as well.

Although examples of carrying out the features described herein have been described, there are numerous other variations, combinations and permutations of the above described devices and techniques that fall within the spirit and scope of the inventions as set forth in the appended claims. The above description and drawings are illustrative only. The features herein are not limited to the illustrated embodiments, and all embodiments of the invention need not necessarily achieve all of the advantages or purposes, or possess all characteristics, identified herein.

The invention claimed is:

1. A method comprising:
   storing a first portion of data to await output processing for transmission in a packet;
   determining that a resource utilization is below a predetermined threshold while the first portion of data is awaiting output processing;
   performing a checksum calculation on the first portion of data in response to determining that the resource utilization is below the predetermined threshold;
   storing results of the checksum calculation; and
   assigning different checksum priorities to different data portions based on time-to-output values for the different data portions.

2. The method of claim 1, further comprising:
   beginning output processing to formulate a packet carrying the first portion of data, wherein the output processing includes the following:
   retrieving the stored results of the checksum calculation;
   using the retrieved results in a further checksum calculation; and
   finalizing and transmitting the packet.

3. The method of claim 1, further comprising maintaining a plurality of checksum calculation queues corresponding to the different priorities.

4. The method of claim 1, further comprising adjusting each of the assigned priorities as a transmission time for the first portion of data approaches.

5. The method of claim 1, further comprising:
   managing checksum calculations across multiple network layers in a layered network protocol, wherein checksum calculations for data at a first network layer are performed at a higher priority than checksum calculations for data at a second network layer.

6. The method of claim 1, further comprising:
   completing the checksum calculation on the first portion of data,
   wherein the step of completing the checksum calculation includes a step of retrieving cached checksum information that was used in a previous packet.

7. The method of claim 1, further comprising:
   managing checksum calculations at an application stage, a transport buffer stage and transport output stage, wherein partial checksum calculations are performed at the application stage and transport buffer stage at a lower priority than checksum calculations performed at the transport output stage.

8. A computer-readable medium, storing computer-executable instructions that, when executed, cause an apparatus to:
   store a first portion of data to await output processing for transmission in a packet;
   determine that a resource utilization is below a predetermined threshold while the first portion of data is awaiting output processing;
   perform a checksum calculation on the first portion of data in response to determining that the resource utilization is below the predetermined threshold;
   store results of the checksum calculation; and
   assign different checksum priorities to different data portions based on time-to-output values for the different data portions.

9. The computer-readable medium of claim 8, further storing computer-executable instructions that, when executed, cause the apparatus to:
   begin output processing to formulate a packet carrying the first portion of data, wherein the output processing includes the following:
   retrieving the stored results of the checksum calculation;
   using the retrieved results in a further checksum calculation; and
   finalizing and transmitting the packet.

10. The computer-readable medium of claim 8, further storing computer-executable instructions that, when executed, cause the apparatus to:
    maintain a plurality of checksum calculation queues corresponding to the different priorities.

11. The computer-readable medium of claim 8, further storing computer-executable instructions that, when executed, cause the apparatus to:
    adjust each of the assigned priorities as a transmission time for the first portion of data approaches.

12. The computer-readable medium of claim 8, further storing computer-executable instructions that, when executed, cause the apparatus to:
    manage checksum calculations across multiple network layers in a layered network protocol, wherein checksum calculations for data at a first network layer are performed at a higher priority than checksum calculations for data at a second network layer.

13. The computer-readable medium of claim 8, further storing computer-executable instructions that, when executed, cause the apparatus to:
complete the checksum calculation on the first portion of data,
wherein completing the checksum calculation includes retrieving cached checksum information that was used in a previous packet.

14. The computer-readable medium of claim 8, further storing computer-executable instructions that, when executed, cause the apparatus to:
manage checksum calculations at an application stage, a transport buffer stage and transport output stage, wherein partial checksum calculations are performed at the application stage and transport buffer stage at a lower priority than checksum calculations performed at the transport output stage.

15. An apparatus, comprising:
a processor; and
memory storing instructions that, when executed by the processor, cause the apparatus to:
store a first portion of data to await output processing for transmission in a packet;
determine that a resource utilization is below a predetermined threshold while the first portion of data is awaiting output processing;
perform a checksum calculation on the first portion of data in response to determining that the resource utilization is below the predetermined threshold;
store results of the checksum calculation; and
assign different checksum priorities to different data portions based on time-to-output values for the different data portions.

16. The apparatus of claim 15, wherein the instructions, when executed by the processor, cause the apparatus to:
begin output processing to formulate a packet carrying the first portion of data, wherein the output processing includes the following:
retrieving the stored results of the checksum calculation;
using the retrieved results in a further checksum calculation; and
finalizing and transmitting the packet.

17. The apparatus of claim 15, wherein the instructions, when executed by the processor, cause the apparatus to:
maintain a plurality of checksum calculation queues corresponding to the different priorities.

18. The apparatus of claim 15, wherein the instructions, when executed by the processor, cause the apparatus to:
adjust each assigned priority as a transmission time for the first portion of data approaches.

19. The apparatus of claim 15, wherein the instructions, when executed by the processor, cause the apparatus to:
manage checksum calculations across multiple network layers in a layered network protocol, wherein checksum calculations for data at a first network layer are performed at a higher priority than checksum calculations for data at a second network layer.

20. The apparatus of claim 15, wherein the instructions, when executed by the processor, cause the apparatus to:
complete the checksum calculation on the first portion of data,
wherein completing the checksum calculation includes retrieving cached checksum information that was used in a previous packet.

21. The apparatus of claim 15, wherein the instructions, when executed by the processor, cause the apparatus to:
manage checksum calculations at an application stage, a transport buffer stage and transport output stage, wherein partial checksum calculations are performed at the application stage and transport buffer stage at a lower priority than checksum calculations performed at the transport output stage.

* * * * *

UNITED STATES PATENT AND TRADEMARK OFFICE
CERTIFICATE OF CORRECTION

PATENT NO. : 8,201,070 B2  
APPLICATION NO. : 12/252061  
DATED : June 12, 2012  
INVENTOR(S) : Vladimir Moltchanov et al.

Page 1 of 1

It is certified that error appears in the above-identified patent and that said Letters Patent is hereby corrected as shown below:

On the Title page; Under Inventors:
Please delete "Vladmir" and replace with --Vladimir--

Signed and Sealed this
Nineteenth Day of February, 2013

Teresa Stanek Rea
*Acting Director of the United States Patent and Trademark Office*